(12) United States Patent
Vielemeyer et al.

(10) Patent No.: US 9,276,097 B2
(45) Date of Patent: Mar. 1, 2016

(54) GATE OVERVOLTAGE PROTECTION FOR COMPOUND SEMICONDUCTOR TRANSISTORS

(75) Inventors: Martin Vielemeyer, Villach (AT); Michael Hutzler, Villach (AT); Gilberto Curatola, Villach (AT); Gianmauro Pozzovivo, Villach (AT)

(73) Assignee: Infineon Technologies Austria AG, Villach (AT)

( * ) Notice: Subject to any disclaimer, the term of this patent is extended or adjusted under 35 U.S.C. 154(b) by 628 days.

(21) Appl. No.: 13/435,447

(22) Filed: Mar. 30, 2012

(65) Prior Publication Data

US 2013/0256699 A1 Oct. 3, 2013

(51) Int. Cl.
*H01L 29/778* (2006.01)
*H01L 29/861* (2006.01)
*H01L 27/02* (2006.01)
*H01L 29/16* (2006.01)
*H01L 29/20* (2006.01)

(52) U.S. Cl.
CPC .......... *H01L 29/778* (2013.01); *H01L 27/0248* (2013.01); *H01L 29/7786* (2013.01); *H01L 29/861* (2013.01); *H01L 29/1608* (2013.01); *H01L 29/2003* (2013.01)

(58) Field of Classification Search
USPC ............... 257/77, 328, 315; 438/172, 391
See application file for complete search history.

(56) References Cited

U.S. PATENT DOCUMENTS

| | | | |
|---|---|---|---|
| 3,566,307 A * | 2/1971 | Morris ........................... 331/111 |
| 5,661,322 A | 8/1997 | Williams et al. |
| 6,437,408 B1 * | 8/2002 | Shih et al. ...................... 257/361 |
| 6,804,096 B2 * | 10/2004 | Nagata ............................. 361/78 |
| 6,965,150 B2 * | 11/2005 | Higashida et al. ............ 257/356 |
| 7,695,997 B2 * | 4/2010 | Shimoida et al. ............... 438/91 |
| 7,825,435 B2 | 11/2010 | Machida et al. |
| 7,893,486 B2 * | 2/2011 | Hirler et al. .................... 257/328 |
| 7,989,885 B2 * | 8/2011 | Hirler et al. .................... 257/330 |
| 8,088,660 B1 | 1/2012 | Siemieniec et al. |
| 8,299,842 B2 * | 10/2012 | Sato ............................... 327/427 |
| 2002/0050602 A1 * | 5/2002 | Narazaki ........................ 257/106 |
| 2004/0084721 A1 * | 5/2004 | Kocon et al. ................... 257/328 |
| 2005/0167742 A1 * | 8/2005 | Challa et al. ................... 257/328 |
| 2007/0023779 A1 * | 2/2007 | Hirose et al. ................... 257/173 |
| 2008/0191216 A1 | 8/2008 | Machida et al. |
| 2010/0264462 A1 * | 10/2010 | Hirler et al. .................... 257/194 |
| 2010/0289073 A1 | 11/2010 | Hsieh |
| 2011/0260216 A1 * | 10/2011 | Hebert ................ H01L 21/8258 257/194 |
| 2011/0266593 A1 | 11/2011 | Hsieh |
| 2011/0303948 A1 * | 12/2011 | Mueller et al. ................ 257/173 |
| 2013/0049159 A1 * | 2/2013 | Schmidt ......................... 257/467 |

(Continued)

FOREIGN PATENT DOCUMENTS

| | | |
|---|---|---|
| CN | 102104073 A | 6/2011 |
| JP | 57130476 A | 8/1982 |

*Primary Examiner* — Jarrett Stark
*Assistant Examiner* — Charles N Ausar-El
(74) *Attorney, Agent, or Firm* — Murphy, Bilak & Homiller, PLLC

(57) ABSTRACT

A transistor device includes a compound semiconductor body, a drain disposed in the compound semiconductor body and a source disposed in the compound semiconductor body and spaced apart from the drain by a channel region. A gate is provided for controlling the channel region. The transistor device further includes a gate overvoltage protection device connected between the source and the gate, the gate overvoltage protection device including p-type and n-type silicon-containing semiconductor material.

22 Claims, 15 Drawing Sheets

(56) References Cited

U.S. PATENT DOCUMENTS

| | | | |
|---|---|---|---|
| 2013/0240894 A1* | 9/2013 | Wurfl et al. | 257/76 |
| 2013/0240952 A1* | 9/2013 | Wong et al. | 257/194 |
| 2013/0299835 A1* | 11/2013 | Hirler et al. | 257/66 |
| 2014/0027814 A1* | 1/2014 | Pfirsch | 257/139 |
| 2014/0231874 A1* | 8/2014 | Hoshi et al. | 257/194 |

\* cited by examiner ions
GATE OVERVOLTAGE PROTECTION FOR COMPOUND SEMICONDUCTOR TRANSISTORS

BACKGROUND

Due to favorable electrical characteristics, especially high breakdown voltage per length, GaN is a promising material for power transistors. The most common realization of GaN based devices is the high electron mobility transistor (HEMT). HEMTs however suffer from inferior reliability compared to their silicon counterparts. Particularly, the gate of an HEMT is vulnerable to overvoltage conditions e.g. caused by bad circuit layout or ESD (electrostatic discharge) damage. Conventional HEMTs do not have a gate protected against overvoltage conditions. Instead, conventional HEMTs must limit the maximum gate voltage to very low values and rely on good circuit design so that the device is not damaged during use, limiting the application of conventional HEMTs.

SUMMARY

According to an embodiment of a transistor device, the transistor device includes a compound semiconductor body, a drain disposed in the compound semiconductor body and a source disposed in the compound semiconductor body and spaced apart from the drain by a channel region. A gate is provided for controlling the channel region. The transistor device further includes a gate overvoltage protection device connected between the source and the gate. The gate overvoltage protection device comprises p-type and n-type silicon-containing semiconductor material.

According to another embodiment of a transistor device, the transistor device includes a GaN semiconductor body, a drain disposed in the GaN semiconductor body and a source disposed in the GaN semiconductor body and spaced apart from the drain by a channel region. A gate is provided for controlling the channel region. The transistor device further includes a gate overvoltage protection device disposed in a first trench formed in the GaN semiconductor body. The gate overvoltage protection device is connected between the source and the gate, and comprises alternating p-type and n-type silicon regions.

According to an embodiment of a method of manufacturing a transistor device, the method includes: forming a drain and a source in a GaN semiconductor body with the drain and the source spaced apart by a channel region; forming a gate operable to control the channel region; forming a first trench in the GaN semiconductor body; and forming a gate overvoltage protection device connected between the source and the gate, the gate overvoltage protection device comprising alternating p-type and n-type silicon regions disposed in the first trench.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Described next are embodiments of a gate overvoltage protection device for compound semiconductor transistors such as HFETs (heterostructure field effect transistors). The term HFET is also commonly referred to as HEMT (high electron mobility transistor), MODFET (modulation-doped FET) or MESFET (metal semiconductor field effect transistor). The terms compound semiconductor field effect transistor, HFET, HEMT, MESFET and MODFET are used interchangeably herein to refer to a field effect transistor incorporating a junction between two materials with different band gaps (i.e. a heterojunction) as the channel. For example, GaAs may be combined with AlGaAs, GaN may be combined with AlGaN, InGaAs may be combined with InAlAs, GaN may be combined with InGaN, etc. For example, the buffer region may comprise GaN or AlGaN and the barrier region may comprises AlGaN, InAlN, AlN, AlInGaN. Also, transistors may have AlInN/AlN/GaN barrier/spacer/buffer layer structure. The term compound semiconductor field effect transistor as used herein may also refer to a field effect transistor fabricated using a single epitaxial compound semiconductor material such as epitaxial SiC. In each case, the gate overvoltage protection device described herein functions like an ESD (electrostatic discharge) diode in that the device protects compound semiconductor transistors from excessive gate voltages.

The gate overvoltage protection device comprises alternating p-type and n-type silicon-containing semiconductor regions connected between the gate and source of a compound semiconductor transistor. The gate overvoltage protection device can be a single pn junction, a single npn or pnp junction, or multiple npn or pnp junctions. The gate overvoltage protection device can be used in various types of circuit applications, e.g. such as a switch mode power supply. The overvoltage protection device increases the robustness of the transistor against voltage overshoots on the gate electrode, preventing damage to the gate of the transistor.

Figure 1:
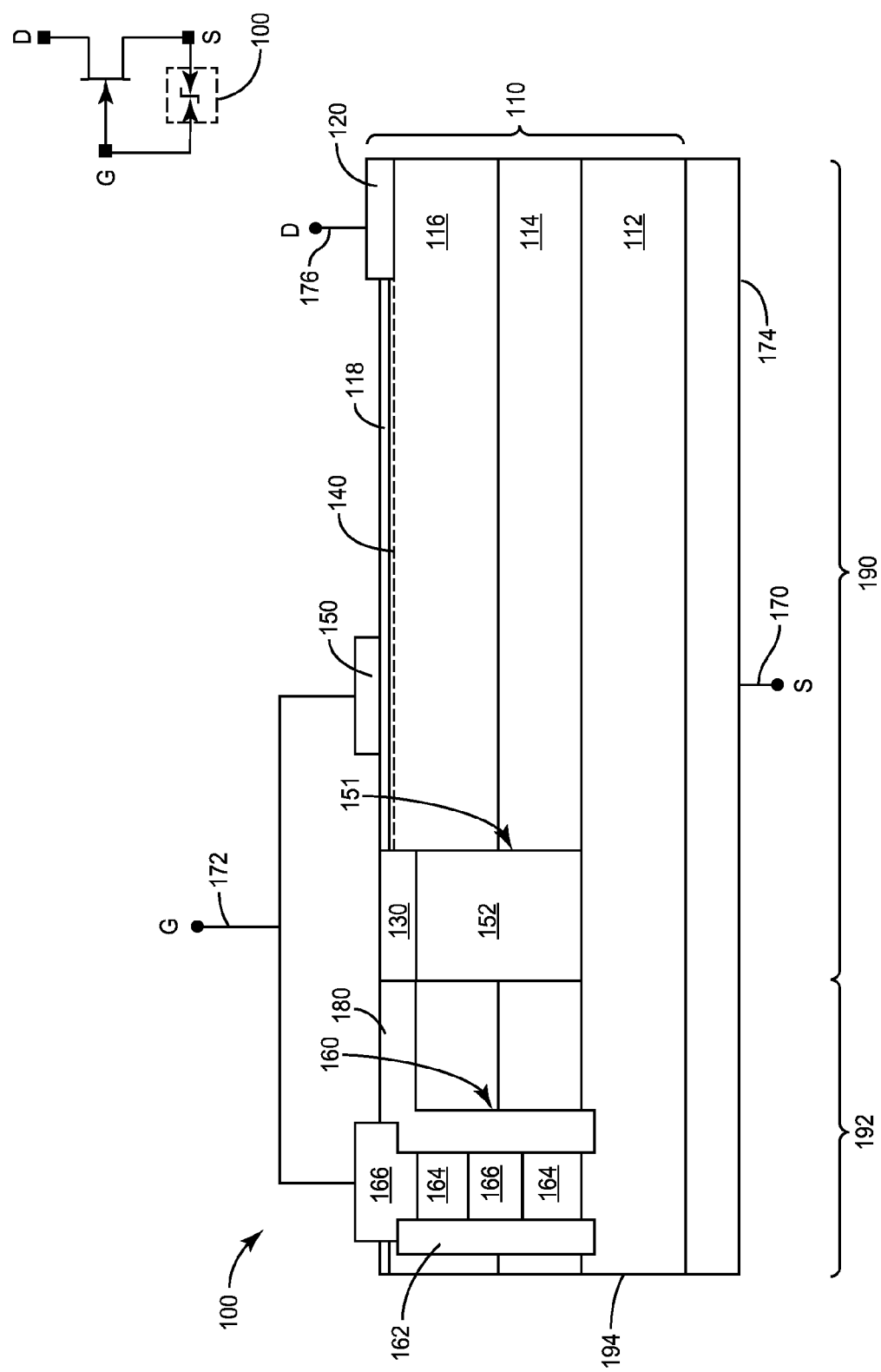
FIG. 1 illustrates a cross-sectional view of an embodiment of a transistor device including a monolithically integrated gate overvoltage protection device.

FIG. 1 illustrates an embodiment of a transistor device which includes an overvoltage protection device 100 monolithically integrated with an HFET. An equivalent circuit schematic of the transistor device is shown in the upper right-hand corner of FIG. 1. The transistor device includes a compound semiconductor body 110, a drain 120 and a source 130 disposed in the compound semiconductor body 110 and spaced apart from one another by a channel region 140, and a gate 150 for controlling the channel region 140. In one embodiment, the compound semiconductor body 110 comprises a doped silicon or doped compound semiconductor substrate 112, a nucleation (seed) layer 114 such as an AlN layer on the doped substrate 112, a first compound semiconductor material 116, also referred to herein as a buffer region, on the nucleation layer 114, and a second compound semiconductor material 118, also referred to herein as a barrier region, on the buffer region 116. The term 'doped substrate' as used herein refers to a substrate purposely doped e.g. via implantation or other techniques and having a relatively higher dopant concentration (and thus higher current flow), or a substrate intrinsically doped e.g. an intrinsically n-doped Si substrate and having a relatively lower dopant concentration (and thus lower current flow).

The drain 120 and source 130 extend from the barrier region 118 into the buffer region 116 and are separated by the channel 140. The gate 150 controls the channel 140 responsive to a voltage applied to the gate 150. The gate 150 may have an underlying material such as p-GaN, SiOx, etc. to manipulate the threshold voltage of the device. The drain 120 and source 130 may have a structure such as an implanted contact region for optimizing contact to the channel 140.

In one embodiment, the buffer region 116 comprises GaN, the barrier region 118 comprises AlGaN and a 2DEG (two-dimensional electron gas) arises in the buffer region 116 between the drain 120 and source 130 at the interface between the buffer and barrier regions 116, 118. In general with GaN technology, the presence of polarization charges and strain effects result in the realization of a two-dimensional charge carrier gas which is a two-dimensional electron or hole inversion layer characterized by very high carrier density and carrier mobility. Such a two-dimensional charge carrier gas forms the channel 140 of the transistor. A thin e.g. 1-2 nm AlN layer can be provided between the GaN buffer region 116 and the AlGaN barrier region 118 to minimize alloy scattering and enhance 2DEG mobility. Other compound semiconductor technologies which have two-dimensional electron and/or hole gasses can also be used. In each case, polarization charges are used to form the two-dimensional charge carrier gas of the device instead of doping and implantation. Other combinations of III-V semiconductor materials can be used in order to form a 2DEG or 2DHG (two-dimensional hole gas) in the buffer region 116 of the device as is well known in the art. In yet another embodiment, the compound semiconductor body 110 comprises a doped SiC substrate and a SiC epitaxial layer on the doped SiC substrate.

According to the embodiment illustrated in FIG. 1, the source 130 is electrically connected to the doped substrate 112 of the compound semiconductor body 110 through a conductive via 152 disposed in a first trench 151 extending through the epitaxial layer(s) of the compound semiconductor body 110 to the doped substrate 112. The gate overvoltage protection device 100 is disposed in a second trench 160 extending through the epitaxial layer(s) to the doped substrate 112. The second trench 160 is laterally spaced apart from the first trench 151 and insulated from the epitaxial layer(s) through sidewall dielectric 162. The sidewall dielectric 162 may not be recessed as shown in FIG. 1, but may reach to the device front side or even above the device front side. Also, the sidewall dielectric 162 may penetrate the substrate 112 or stop on the substrate 112.

The gate overvoltage protection device 100 comprises alternating regions of p-type and n-type silicon-containing material 164, 166 such as alternating regions of p-type and n-type SiC for the SiC embodiment described above or alternating regions of p-type and n-type silicon for the GaN embodiment described above. The order of the p-type and n-type silicon-containing material 164, 166 may be reversed in the embodiments described herein. As shown in FIG. 1, the alternating regions of p-type and n-type silicon-containing material 164, 166 can be disposed entirely within the second trench 160 to form the gate overvoltage protection device 100. Alternatively, the first trench 151 can be filled entirely with p-type silicon-containing semiconductor material e.g. p-type Si or p-type SiC and the second trench 160 can also be filled entirely with p-type silicon-containing semiconductor material. The doped substrate 112 in this case is of the opposite doping type e.g. n-type Si or n-type SiC and completes the structure of the gate overvoltage protection device 100 as a pnp device. In yet another embodiment, the gate overvoltage protection device 100 can be implemented as an npn device by providing an n-type doped substrate 112, filling the first trench 151 with n-type silicon-containing semiconductor material such as n-type Si or n-type SiC, filling the upper part of the second trench 160 with n-type silicon-containing semiconductor material and filling the lower part of the second trench 160 with p-type silicon-containing semiconductor material.

In each case, the gate overvoltage protection device 100 is connected between the source (S) and gate (G) terminals 170, 172 of the transistor as illustrated in FIG. 1. The transistor shown in FIG. 1 is a quasi-vertical device in that current flows laterally between the drain 120 and source 130 through the channel 140 and vertically from the source 130 to the doped substrate 112 through the conductive via 152 disposed in the first trench 151. An interface is shown in FIG. 1 between the source 130 and the underlying conductive via 152. The interface may not actually exist for example in the case of the source 130 and conductive via 152 comprising the same material. The source terminal 170 is connected to the doped substrate 112 through a metallization 174. A separate drain (D) terminal 176 is also provided, which is connected to the drain 120.

The substrate 112 of the compound semiconductor body 110 is doped meaning that the substrate 112 enables current flow. The substrate 112 may have a different kind of doping so that an additional npn or pnp junction is provided. In one particular embodiment, the doped substrate 112 is an n-type doped Si substrate, an n-type silicon region 166 of the gate overvoltage protection device 100 is electrically connected to the gate 150 as schematically shown in FIG. 1 and a p-type silicon region 164 of the gate overvoltage protection device 100 contacts the n-type doped Si substrate 112.

The transistor device may further include a device isolation region 180 such as a region of silicon oxide or an implanted region adjacent the source 130. According to this embodiment, the source 130, drain 120 and channel 140 of the transistor are disposed in an active region 190 of the device which is surrounded by the device isolation region 180. The device isolation region 180 provides electrical isolation for the transistor. The gate overvoltage protection device 100 is laterally spaced apart from the source 130 by the device isolation region 180 and therefore is disposed in an inactive region 192 of the device e.g. at the die edge 194 as shown in FIG. 1. The device isolation region 180 may extend over the second trench 160. The region between the second trench 160 and the die edge 194 is inactive, and therefore the device isolation region 180 may be provided fully in this region, partly in the inactive region or not at all. Alternatively, the second trench 160 can be formed in another part of the inactive region 192 as described later herein with reference to FIGS. 4A and 4B or in the active region 190 of the device.

In each case, the trenches 150, 160 can be formed by etching. For example, a sacrificial plug can be used which comprises a material such as silicon oxide deposited and structured on the doped substrate 112 before e.g. GaN-deposition. The sacrificial plugs are removed after the epitaxial layer(s) of the compound semiconductor body 110 are formed. An isolation layer 162 is formed in the resulting empty second trench 160. The isolation layer 162 can be formed e.g. by a thin TEOS deposition with a subsequent spacer etch. Alternatively, the sacrificial plugs can be removed using lithography so that a thin oxide layer 162 remains on the trench sidewalls and the oxide is removed from the bottom of the second trench 160.

In either case, a stack of different doped silicon layers 164, 166 (p-type and n-type) is then formed in the second trench 160 e.g. by repeated deposition and recess etch processes. Alternatively, the stack of different doped silicon layers 164, 166 can be formed in the second trench 160 by depositing silicon of one doping type and implanting dopants of the other type. Other materials than silicon and silicon oxide can be used to form the trench structures. Also, an implant may be used to produce doped 'bubbles' below the trench structures e.g. to reduce contact resistance and/or generate an additional npn or pnp junction. In each case, the resulting npn or pnp junctions in the path from the gate 150 to the doped substrate 112 and back to the source 130 determine the robustness of the gate overvoltage protection device 100. Furthermore, the cross-sectional area and doping profile define the voltage robustness and leakage of the overvoltage protection device 100.

According to the embodiment illustrated in FIG. 1, the first trench 151 includes only one type of silicon 152 having the same doping as the underlying doped substrate 112. In this case, the gate overvoltage protection device 100 is formed entirely in the second trench 160. For silicon-based ESD protection diodes, every npn or pnp structure increases the ESD diode breakdown voltage by about 6V. Similar results can be expected for compound semiconductor transistors using the gate overvoltage protection device 100 described herein when alternating regions of p-type and n-type silicon 164, 166 are used to form the protection device 100. The diode breakdown voltage can be adjusted by changing the pn-junction parameters.

Figure 2:
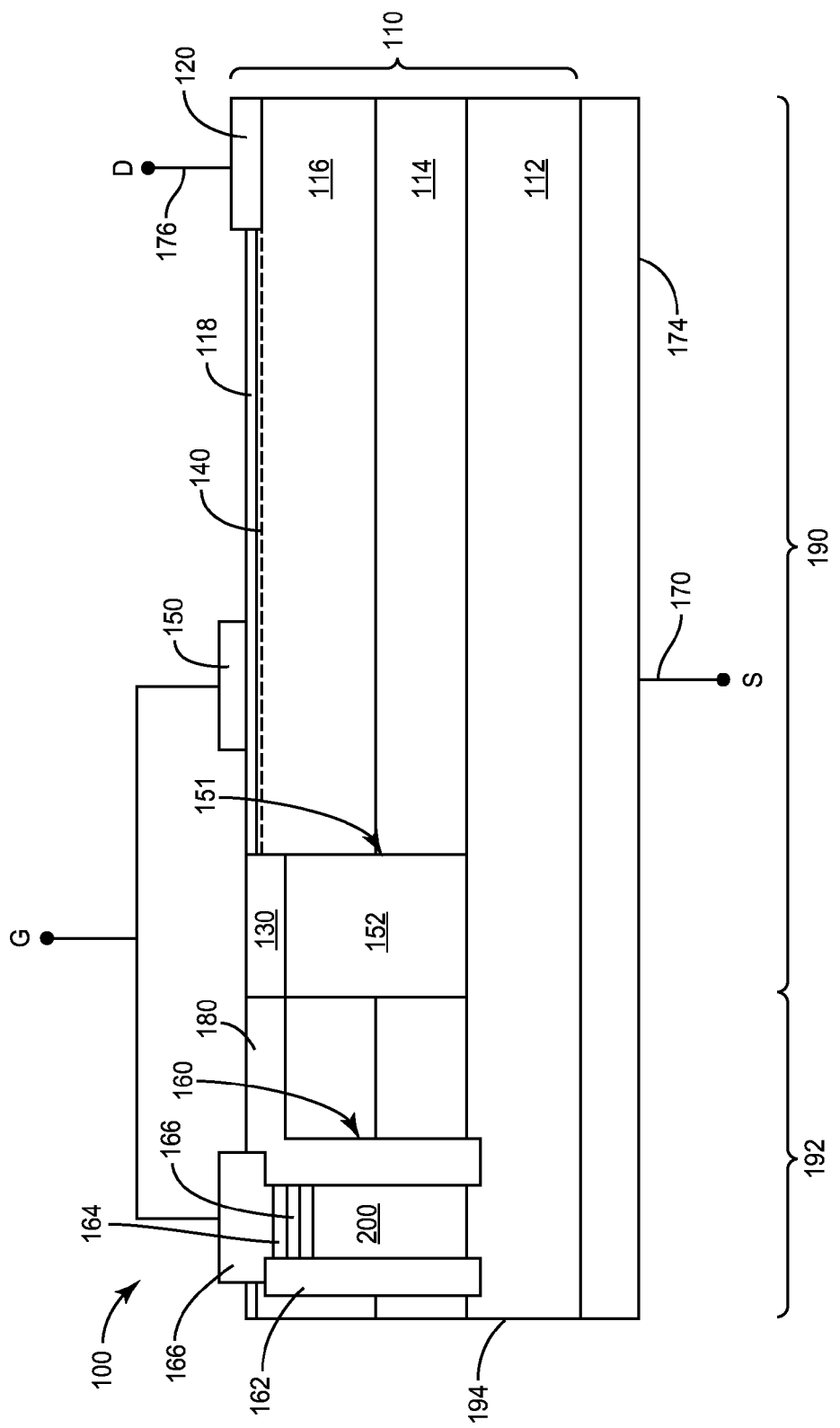
FIG. 2 illustrates a cross-sectional view of another embodiment of a transistor device including a monolithically integrated gate overvoltage protection device.

FIG. 2 illustrates another embodiment of a transistor device which includes the gate overvoltage protection device 100 monolithically integrated with an HFET. The embodiment shown in FIG. 2 is similar to the embodiment shown in FIG. 1, although the alternating regions of p-type and n-type silicon 164, 166 which form the gate overvoltage protection device 100 end prior to the doped substrate 112. According to this embodiment, the gate overvoltage protection device 100 is connected at one end to the gate 172 and to the doped substrate 112 at an opposing end through a conductive via 200 disposed in the second trench 160 between the alternating regions of p-type and n-type silicon 164, 166 and the doped substrate 112. The gate overvoltage protection device 100 shown in FIG. 2 has a smaller cross-sectional area than the embodiment shown in FIG. 1, resulting in different voltage robustness and leakage characteristics. Similar to the embodiment shown in FIG. 1, the gate overvoltage protection device 100 is disposed in the inactive region 192 of the device at the die edge 194.

Figure 3:
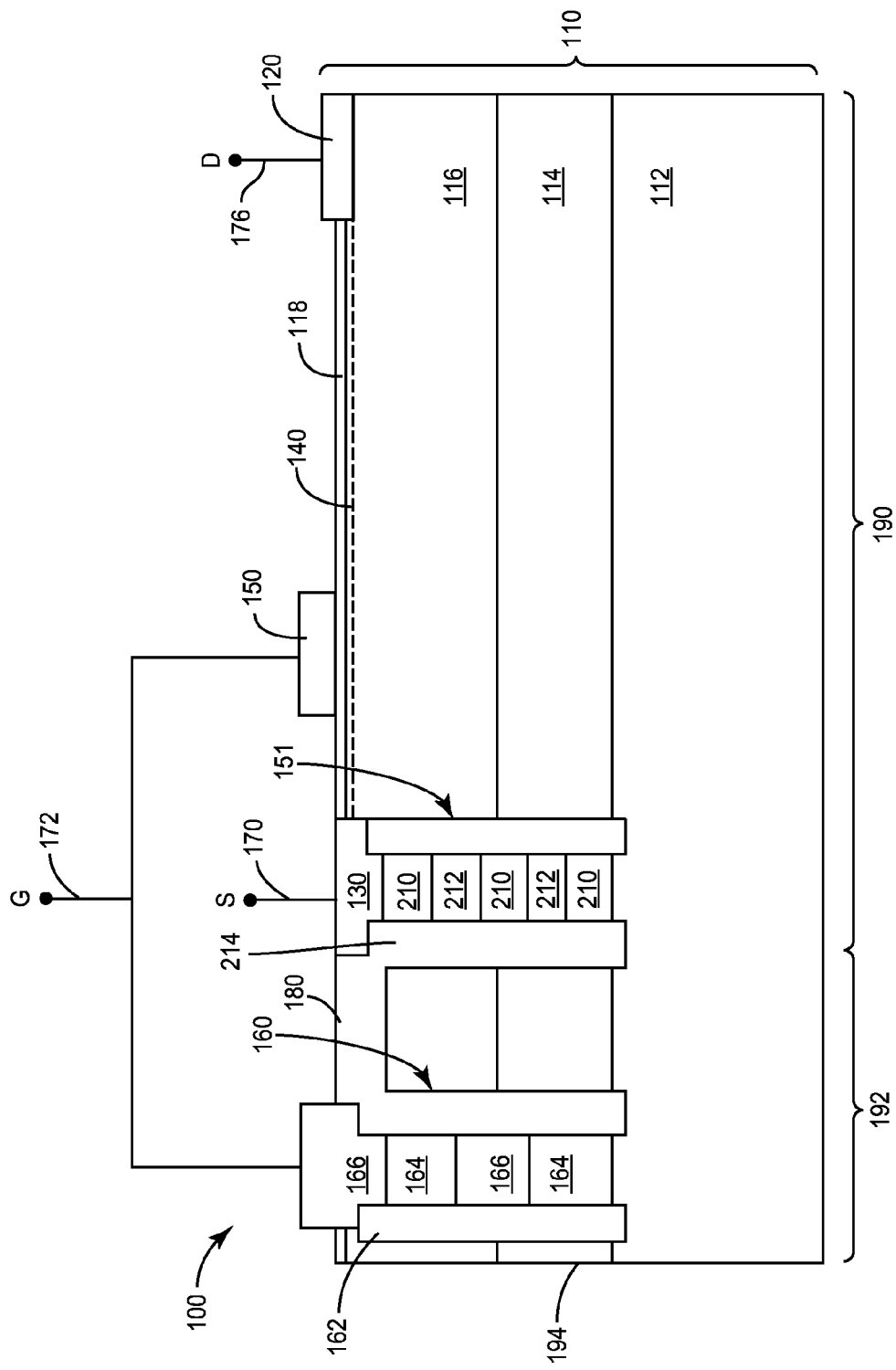
FIG. 3 illustrates a cross-sectional view of yet another embodiment of a transistor device including a monolithically integrated gate overvoltage protection device.

FIG. 3 illustrates yet another embodiment of a transistor device which includes the gate overvoltage protection device 100 monolithically integrated with an HFET. The embodiment shown in FIG. 3 is similar to the embodiment shown in FIG. 1, however the gate overvoltage protection device 100 is formed in both the first trench 151 below the source 130 and in the second trench 160. According to this embodiment, the transistor is a lateral device in that the source and drain terminals 170, 176 are at the same side of the device. This is in contrast to FIGS. 1 and 2, which illustrate the transistor as a quasi-vertical device with the source and drain terminals 170, 176 at different (opposing) sides of the device. In more detail, the gate overvoltage protection device 100 comprises a first series of alternating regions of p-type and n-type silicon 210, 212 disposed in the first trench 151 below the source 130 and a second series of alternating regions of p-type and n-type silicon 164, 166 disposed in the second trench 160 laterally spaced apart from the first trench 151. Both trenches 150, 160 extend through the epitaxial layer(s) of the compound semiconductor body 110 to the doped substrate 112, and the gate overvoltage protection device 100 in both trenches 150, 160 is electrically insulated from the epitaxial layer(s) through sidewall dielectric 162, 214.

The gate 150 is connected to the doped substrate 112 through the second series of alternating p-type and n-type silicon regions 210, 212. The source 130 is similarly connected to the doped substrate 112 through the first series of alternating p-type and n-type silicon regions 164, 166. A device isolation region 180 such as a region of silicon oxide or an implanted region can be provided adjacent the source 130, so that the source 130 contacts the channel region 140 at one side and the device isolation region 180 at the opposing side. The source 130 is laterally spaced apart from the second trench 160 and second series of alternating p-type and n-type silicon regions 164, 166 by the device isolation region 180, with the transistor disposed in an active region 190 of the device and the gate overvoltage protection device 100 partly disposed in the active region 190 and partly in the inactive region 192 at the chip edge 194.

Both trenches 150, 160 need not contain the same layer stack. For example when a vertical device is provided as shown in FIGS. 1 and 2, the source trench 151 may only include one type of silicon which has the same doping as the silicon substrate 112 to form a conductive via 152 which connects the source 130 to the substrate 112 as previously described herein and shown in FIGS. 1 and 2. In this case, the entire overvoltage protection stack 164, 166 is provided in the second trench 160. In contrast, FIG. 3 shows a lateral device with the gate overvoltage protection device 100 formed in both trenches 150, 160. The number, thickness and doping of the different pn layers 164, 166, 210, 212 may different between the first and second trenches 15, 160 and also differ within each individual trench.

Figure 4A:
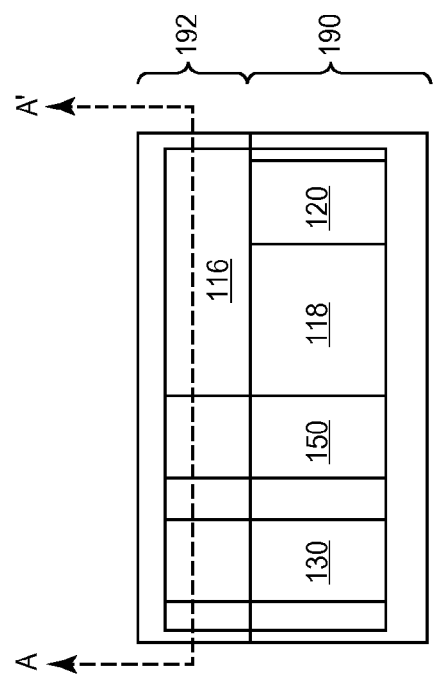
FIGS. 4A and 4B illustrate respective plan and cross-sectional views of still another embodiment of a transistor device including a monolithically integrated gate overvoltage protection device.
Figure 4B:
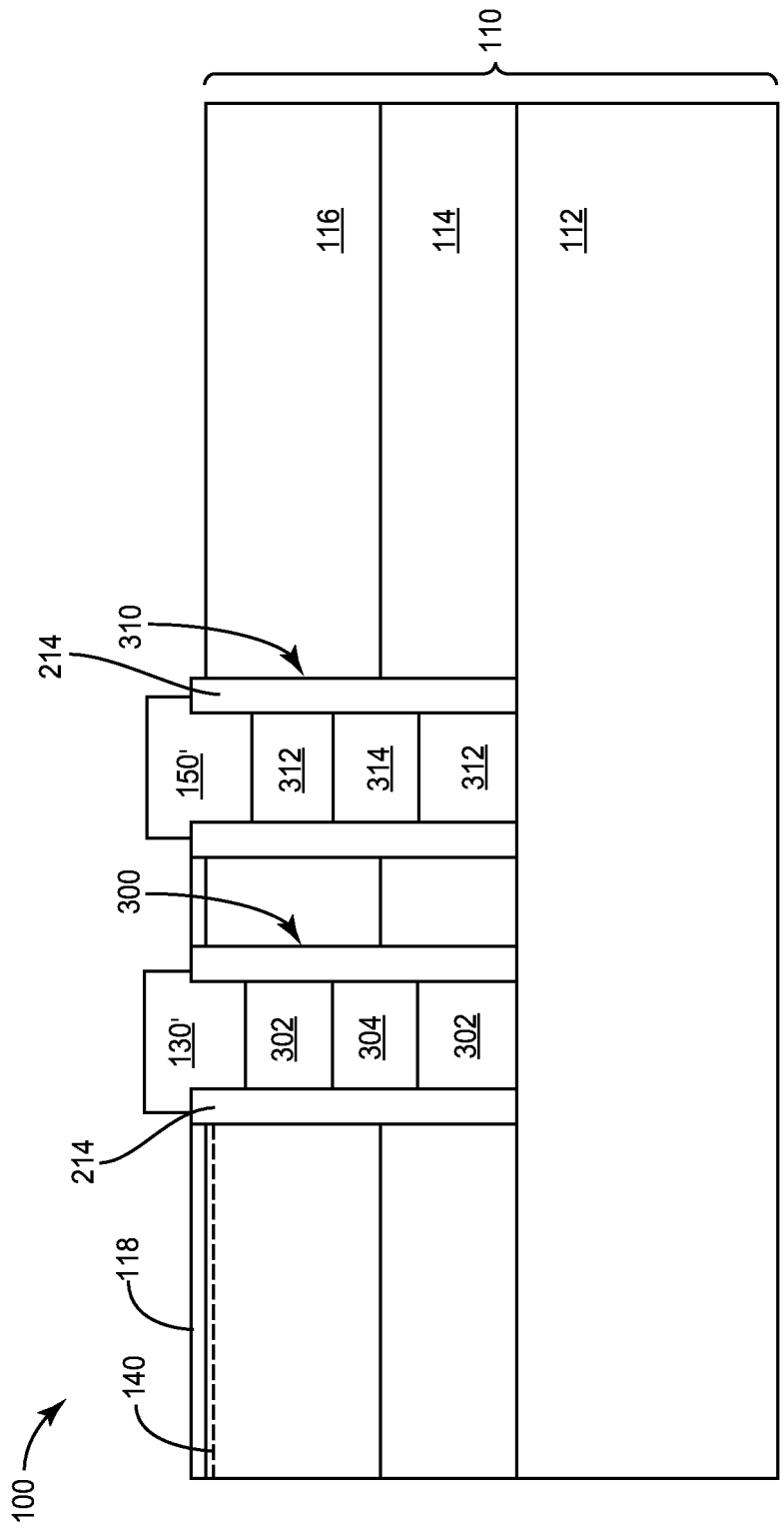

FIG. 4A illustrates a plan view of still another embodiment of a transistor device which includes the gate overvoltage protection device 100 monolithically integrated with an HFET, and FIG. 4B illustrates a corresponding cross-sectional view of the device along the line labeled A-A' in FIG. 4A. According to this embodiment, the gate overvoltage protection device 100 is disposed in an inactive region 192 of the device. The source 130 and gate 150 both extend from the active region 190 of the device into the inactive region 192. The barrier layer 118 of the device is removed in a part of the inactive region 192 so that there is no two-dimensional charge carrier gas (channel) 140 in this part of the die and therefore the gate 150 is 'inactive' in this region in that there is no channel to control. The drain 120 may also be removed in this area of the inactive region 192. The channel is non-existent in the part of the inactive region 192 without the barrier layer 118, and therefore the drain 120 need not necessarily be removed here. However it may be beneficial to remove the drain 120 to lower leakage, but not necessary. A first trench 300 extends from the extended source region 130' to the underlying doped substrate 112, and a second trench 310 extends from the extended (inactive) gate region 150' also to the underlying doped substrate 112. The gate overvoltage protection device 100 includes a first series of alternating p-type and n-type silicon regions 302, 304 disposed in the first trench 300 below the extended source region 130', and a second series of alternating p-type and n-type silicon regions 312, 314 disposed in the second trench 310 below the extended (inactive) gate region 150'. The first series of alternating p-type and n-type silicon regions 302, 304 disposed in the first trench 300 connects the extended source region 130' to the doped substrate 112 in the inactive region 192, and the second series of alternating p-type and n-type silicon regions 312, 314 similarly connects the extended (inactive) gate region 150' to the doped substrate 112 in the inactive region 192 to form the gate overvoltage protection device 100.

Figure 5:
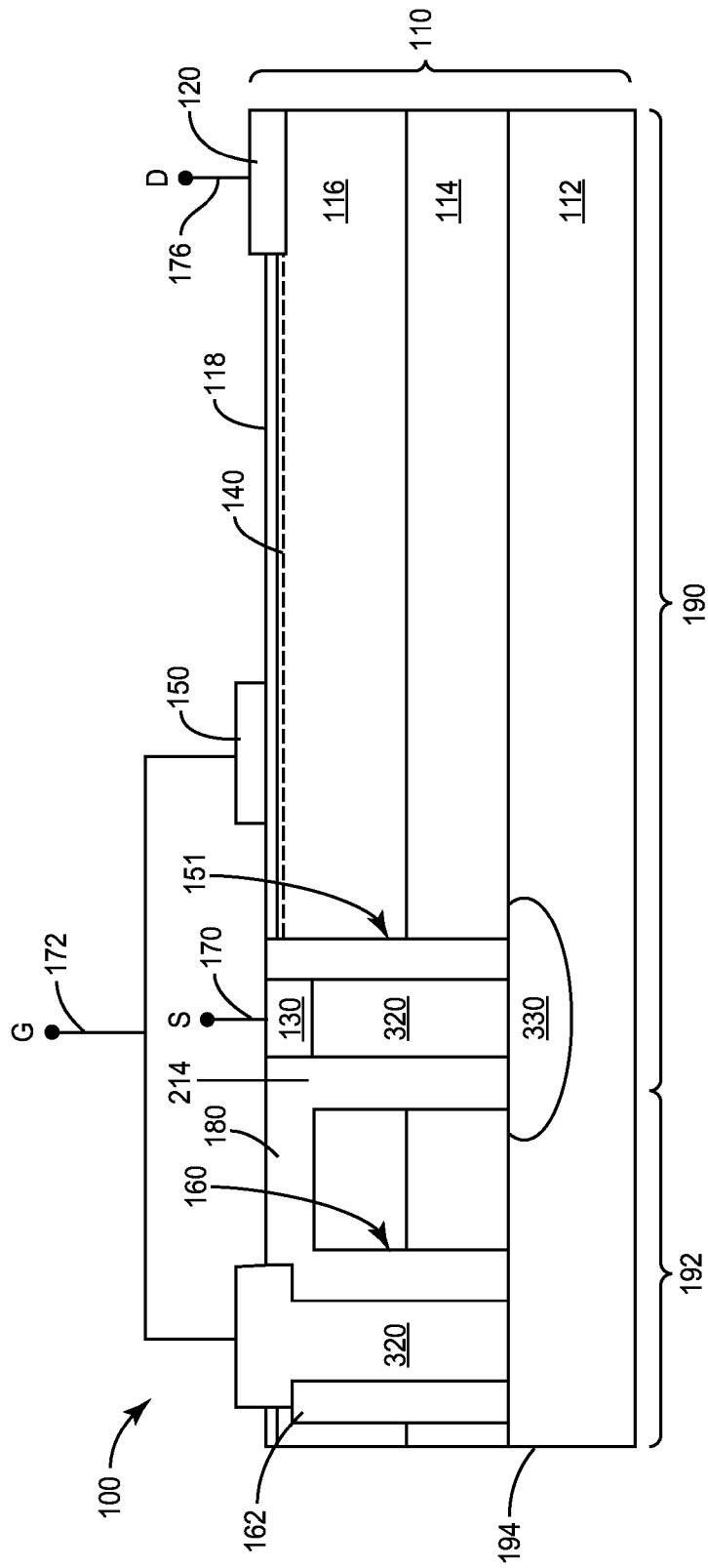
FIG. 5 illustrates a cross-sectional view of an embodiment of a transistor device including a monolithically integrated gate overvoltage protection device formed in part by an implanted region of the substrate.

FIG. 5 illustrates another embodiment of a transistor device which includes the gate overvoltage protection device 100 monolithically integrated with an HFET. The embodiment shown in FIG. 5 is similar to the embodiment shown in FIG. 3, however the first and second trenches 150, 160 are filled with a doped material 320 such as doped Si or SiC of the same doping type as the substrate 112 e.g. n-type (or p-type). An implanted region 330 is formed in the doped substrate 112 underneath and in contact with the filled first trench 151/320. The implanted region 330 has the opposite doping type of the filled trenches 150/320, 160/320 and the substrate 112 e.g. p-type in the present example. According to this embodiment, the gate overvoltage protection device 100 is an npn or pnp device formed by the filled second trench 160/320, the doped substrate 112 in contact with the filled second trench 160/320, the implanted region 330 and the filled first trench 151/320.

Figure 6:
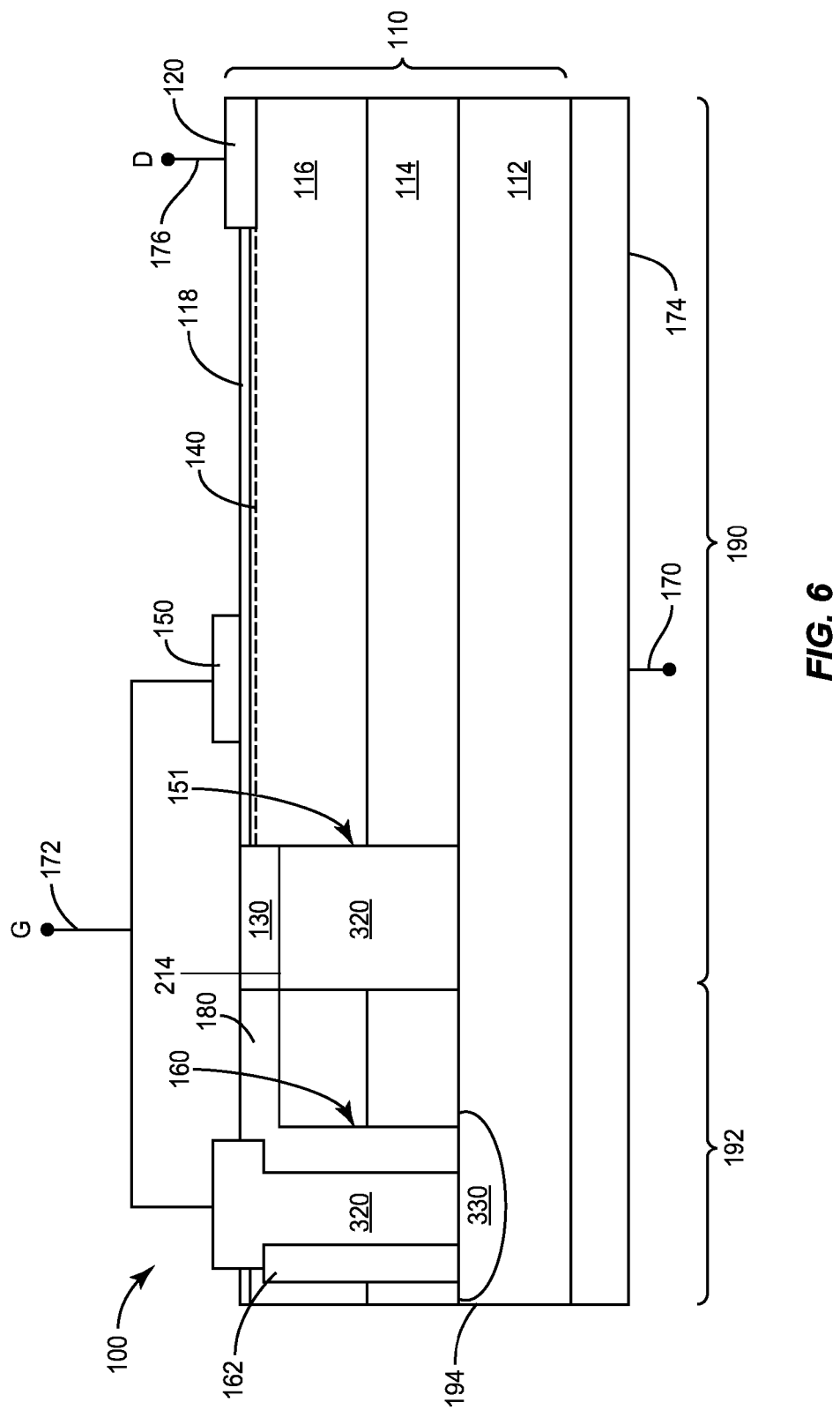
FIG. 6 illustrates a cross-sectional view of another embodiment of a transistor device including a monolithically integrated gate overvoltage protection device formed in part by an implanted region of the substrate.

FIG. 6 illustrates an embodiment which is similar to the embodiment shown in FIG. 5, however the implanted region 330 is formed underneath and in contact with the filled second trench 160/320 instead of the filled first trench 151/320. The gate overvoltage protection device 100 again is an npn or pnp device depending on the doping types, and formed by the two filled trenches 150/320, 160/320, the implanted region 330 and the doped substrate 112 as described above.

Figure 7:
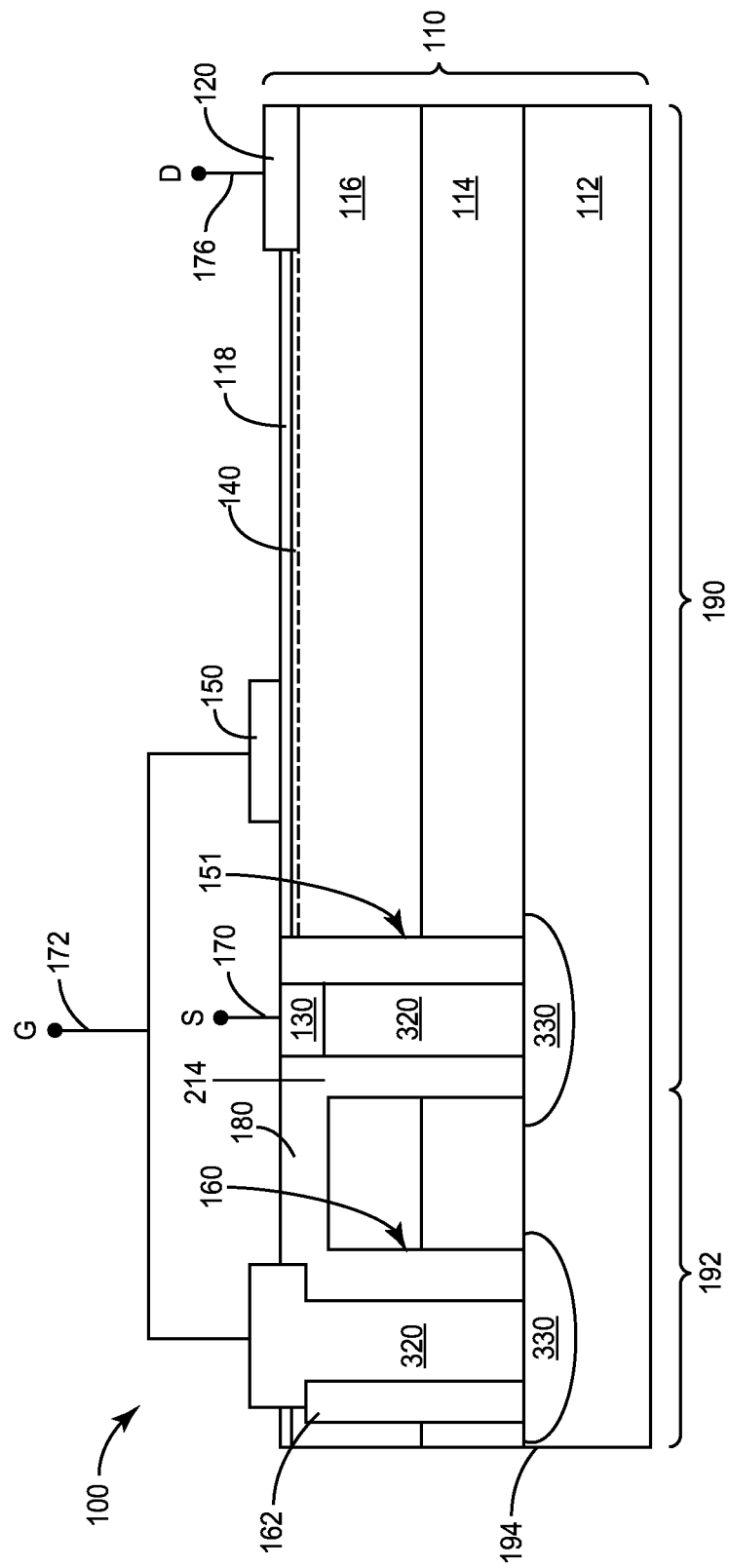
FIG. 7 illustrates a cross-sectional view of yet another embodiment of a transistor device including a monolithically integrated gate overvoltage protection device formed in part by an implanted region of the substrate.

FIG. 7 illustrates another embodiment which is similar to the embodiment shown in FIG. 5, however implanted regions 330 are formed underneath and in contact with both filled trenches 150/320, 160/320. Both implanted regions 330 have the opposite doping type of the material 320 filling the first and second trenches 150, 160 and the substrate 112. According to this embodiment, the gate overvoltage protection device 100 is an npnpn or pnpnp device formed by the filled second trench 160/320, the implanted region 330 under the second trench 160, the doped substrate 112 between the two implanted regions 330, the implanted region 330 under the first trench 151 and the filled first trench 151/320.

Figure 8:
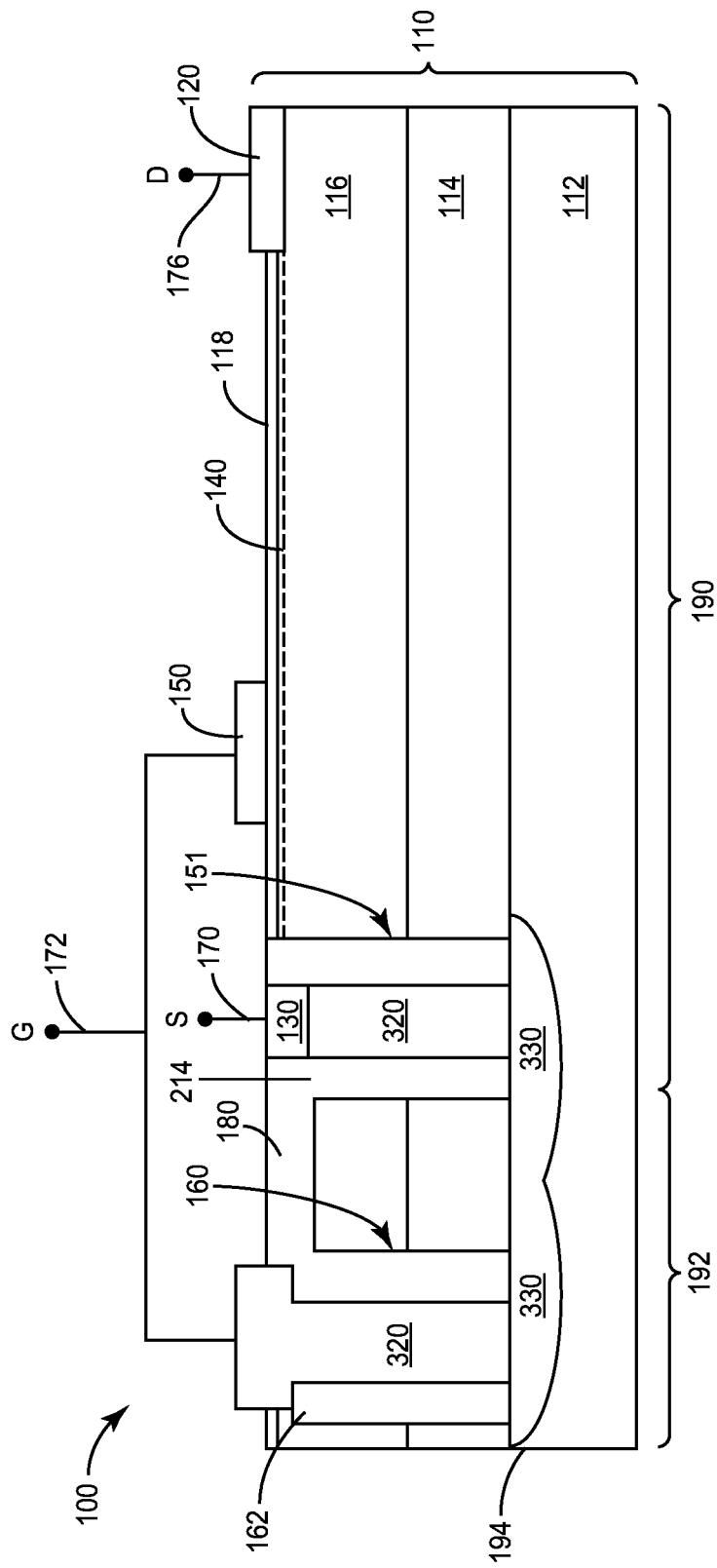
FIG. 8 illustrates a cross-sectional view of still another embodiment of a transistor device including a monolithically integrated gate overvoltage protection device formed in part by an implanted region of the substrate.

FIG. 8 illustrates an embodiment which is similar to the embodiment shown in FIG. 7, however the implanted regions 330 are formed such that they contact each other in a region of the substrate 112 between the trenches 150, 160. This way, the implanted region 330 is continuous in the doped substrate 112 between the first and second trenches 150, 160 and connects the first filled trench 151/320 to the second filled trench 160/320. According to this embodiment, the gate overvoltage protection device 100 is an npn or pnp device formed by the filled second trench 160/320, the continuous implanted region 330 and the filled first trench 151/320. The sidewall dielectric 214 in the first trench 151 is optional according to this embodiment.

Figure 9:
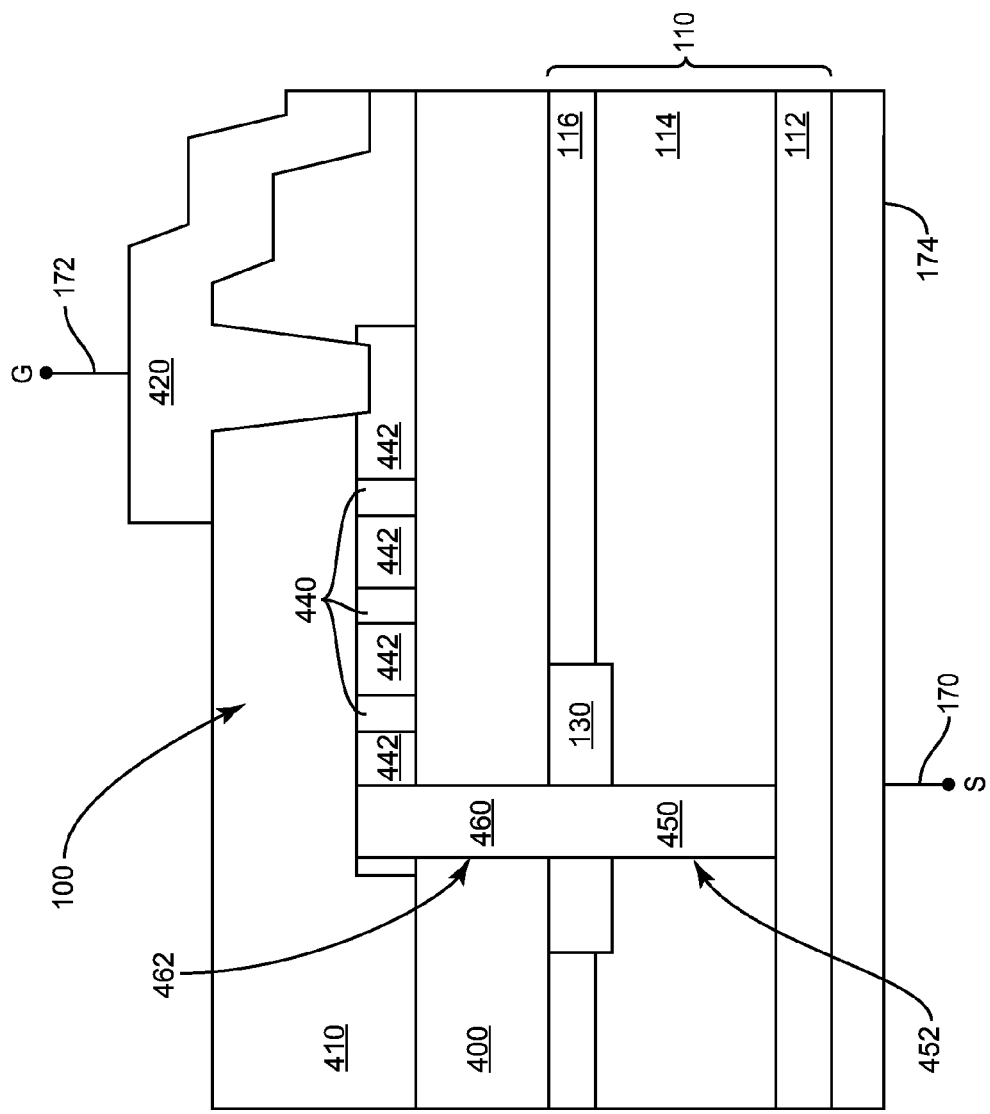
FIG. 9 illustrates a cross-sectional view of an embodiment of a transistor device including a gate overvoltage protection device disposed on an inter-layer dielectric.

FIG. 9 illustrates an embodiment of a transistor device which includes the gate overvoltage protection device 100 disposed above the compound semiconductor body 110. According to this embodiment, the transistor device includes one or more thick interlayer dielectrics (ILDs) 400, 410 and one or more metal layers 420. A silicon-containing material such as polycrystalline is deposited on the first (lower) ILD layer 400. The silicon-containing material is structured and doped to get an overvoltage protection structure 100 which comprises alternating regions, 442 of p-type and n-type silicon-containing material. The transistor can be operated as a quasi-vertical device by contacting the source 130 to the doped substrate 112.

Figure 10:
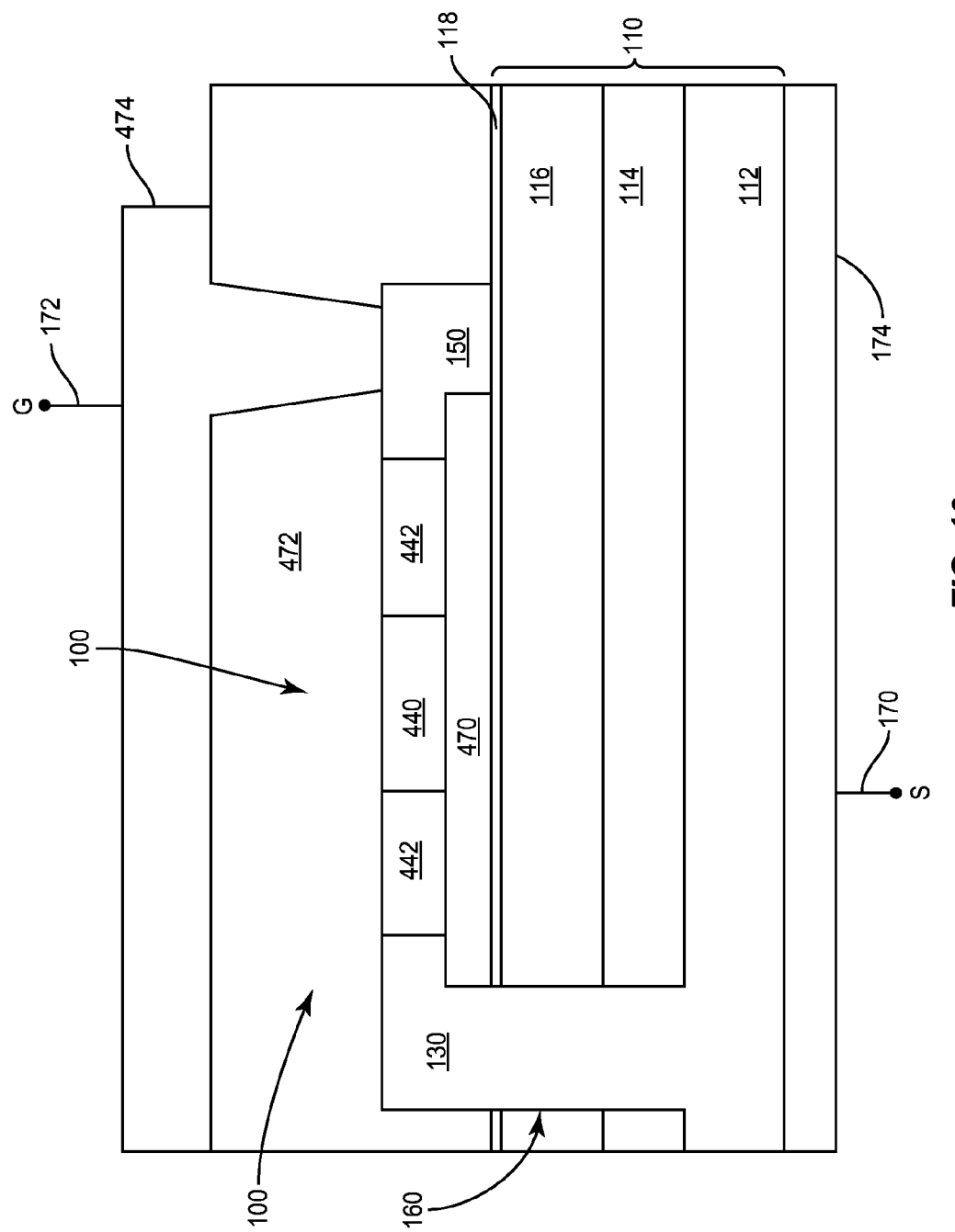
FIG. 10 illustrates a cross-sectional view of an embodiment of a quasi-vertical transistor device including a gate overvoltage protection device disposed on a thin dielectric layer.
Figure 11:
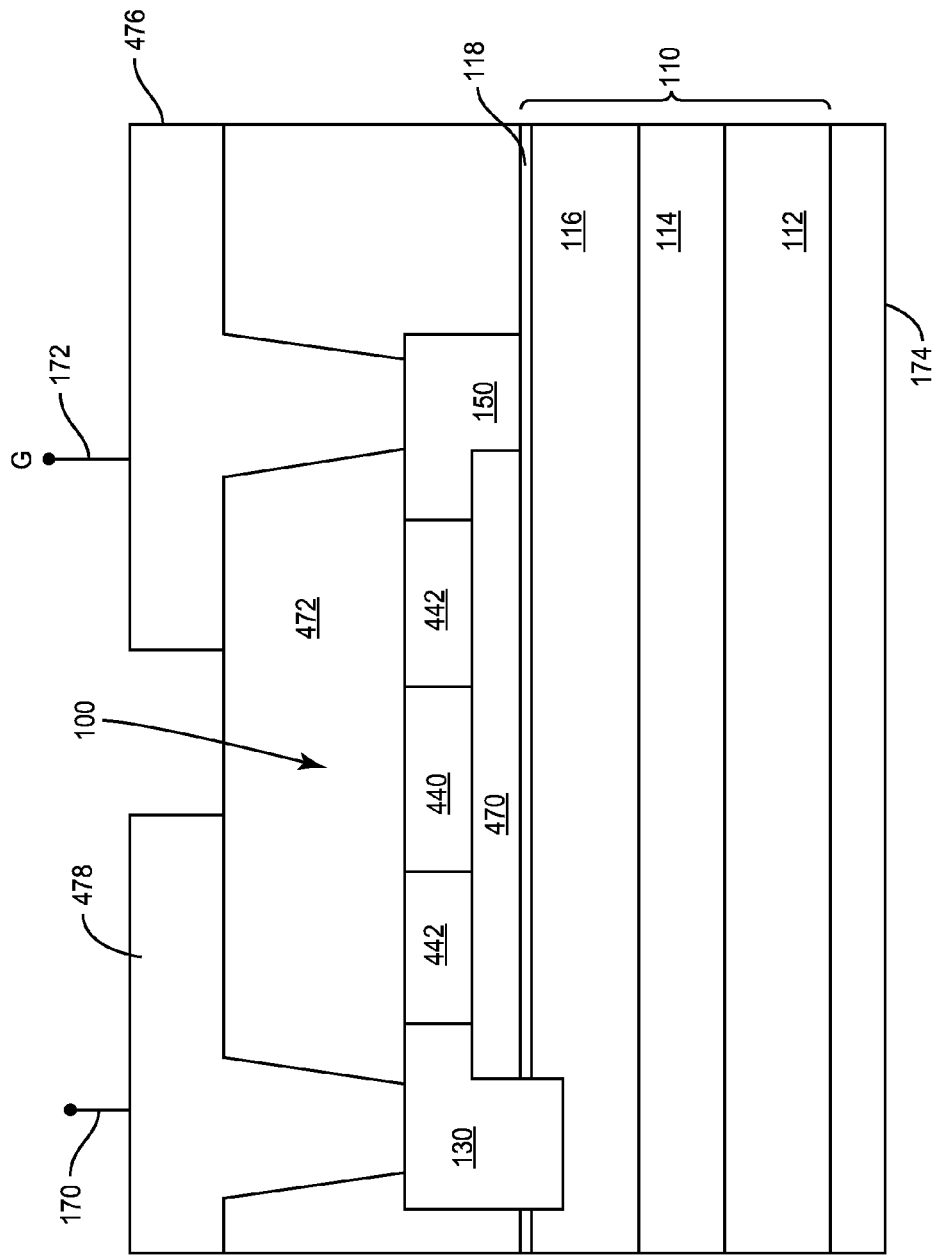
FIG. 11 illustrates a cross-sectional view of an embodiment of a lateral transistor device including a gate overvoltage protection device disposed on a thin dielectric layer.

In more detail, the source 130 is electrically connected to the doped substrate 112 through a conductive via 450 disposed in a trench 452 extending from the source 130 through the epitaxial layer(s) of the compound semiconductor body 110 to the doped substrate 112 of the compound semiconductor body 110. One of the p-type or n-type silicon regions, 442 of the gate overvoltage protection device 100 is electrically connected to the gate 150 through the metal wire layer(s) 420. The gate 150 is out of view on FIG. 9. A different one of the p-type or n-type silicon regions, 442 of the gate overvoltage protection device 110 is electrically connected to the source 130 through a conductive via 460 disposed in a trench 462 extending through the lower ILD layer 400 to the source 130. Alternatively, only one pnp or npn junction is provided between the source 120 and gate 150 e.g. as shown in FIGS. 10 and 11. The gate overvoltage protection device 100 is connected between the source 130 and gate 150 of the compound semiconductor transistor according to this arrangement. In one particular embodiment, the gate overvoltage protection device 100 includes a first n-type silicon region 442 on the lower ILD layer 400 at one end connected to the gate 150, a second n-type silicon region 442 on the lower ILD layer 400 at the opposing end connected to the source 130 and at least one p-type silicon region on the lower ILD layer 400 separating the endmost n-type silicon regions 442.

Source, gate and drain terminals 170, 172, 176 are connected to the corresponding regions of the compound semiconductor transistor as previously described herein. The drain terminal is out of view in FIG. 9. An additional terminal may optionally be provided in order to use the gate overvoltage protection device 100 as a temperature sensor. However if the natural gate-to-source leakage of the transistor is small enough, the overvoltage protection device leakage can be directly measured between the source and gate terminals 170, 172. In this case, a pulsed measurement and a driver for reading the signal can be provided. Otherwise, an additional sense terminal is provided for sensing the device temperature.

FIG. 10 illustrates another embodiment of a transistor device which includes the gate overvoltage protection device 100 disposed above the compound semiconductor body 110. The embodiment shown in FIG. 10 is similar to the embodiment shown in FIG. 9, however the gate overvoltage protection device 100 is disposed on a thin first isolation layer 470 and covered by a thicker ILD 472. An electrical connection is provided to the gate overvoltage protection device 100 through one layer metallization 474.

FIG. 11 illustrates yet another embodiment of a transistor device which includes the gate overvoltage protection device 100 disposed above the compound semiconductor body 110. The embodiment shown in FIG. 11 is similar to the embodiment shown in FIG. 12, however the transistor is a lateral device and therefore the gate and source connections are provided at the same side of the device. The gate overvoltage protection device 100 is disposed on a thin first isolation layer 470 and covered by a thicker ILD 472. The gate overvoltage protection device 100 is connected between the source 120 and gate 150. An electrical connection is provided at each end of the gate overvoltage protection device 100 at the same side of the device through two different metallizations 476, 478.

Figure 12:
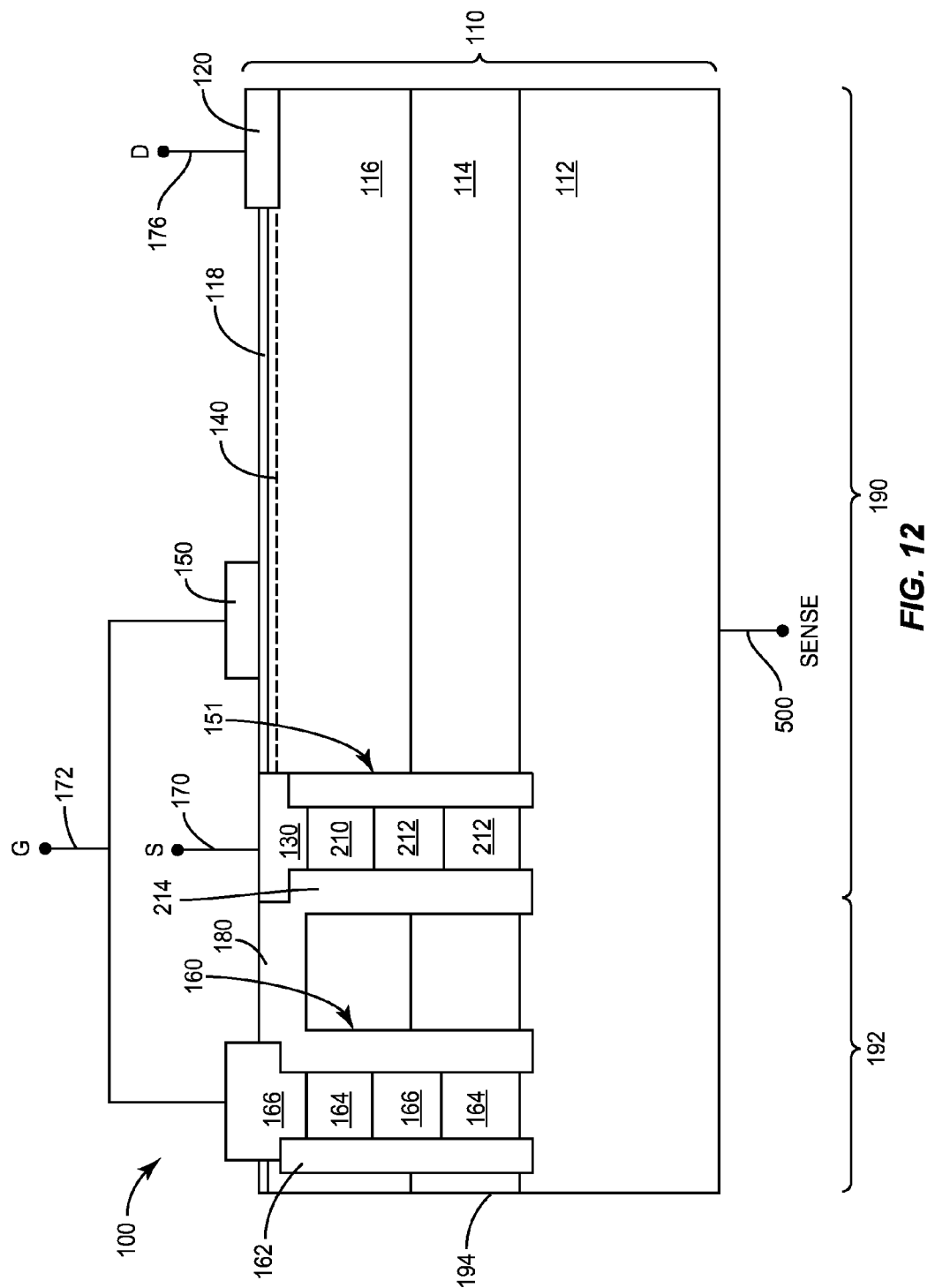
FIG. 12 illustrates a cross-sectional view of an embodiment of a transistor device including a monolithically integrated gate overvoltage protection device with an additional terminal for temperature sensing.

FIG. 12 shows an embodiment of a lateral compound semiconductor transistor with the gate overvoltage protection device 100 and an additional terminal 500 connected to the overvoltage protection device 100 so that the protection device can also be used as a temperature sensor. The embodiment shown in FIG. 12 is similar to the embodiment shown in FIG. 3, with the addition of sense terminal 500 connected to the doped substrate 112. The leakage current through the back-to-back to pn diodes of the gate overvoltage protection device 100 is highly temperature dependent. If device parameters are designed such that the leakage of the overvoltage protection device 100 is significantly larger than the transistor gate-to-source leakage, the gate overvoltage protection device leakage current is a measure of the overall device temperature. This might not be possible for all normally-off HEMTs, since depending on the principle, some HEMTs have a very high GaN gate-to-source leakage. This limitation can be circumvented by adding an extra temperature sense terminal 500 e.g. as shown in FIG. 12. The leakage current now flows from the sense terminal 500 through the overvoltage protection device 100 to the source terminal 170 and therefore can be measured independent of transistor gate-to-source leakage. A different number of pn junction stacks can be used in the first trench 151 between the source and sense terminals 170, 500 than in the second trench 160 between the gate and sense terminals 172, 500. Also the width of the trenches 150, 160 can be changed to influence the leakage.

With only layout modifications, a poly resistor structure can also be embedded in an ILD of a compound semiconductor structure e.g. of the kind shown in FIG. 9. In this case the temperature dependent resistance of the poly resistor can be measured independent of transistor gate-to-source leakage.

Figure 13:
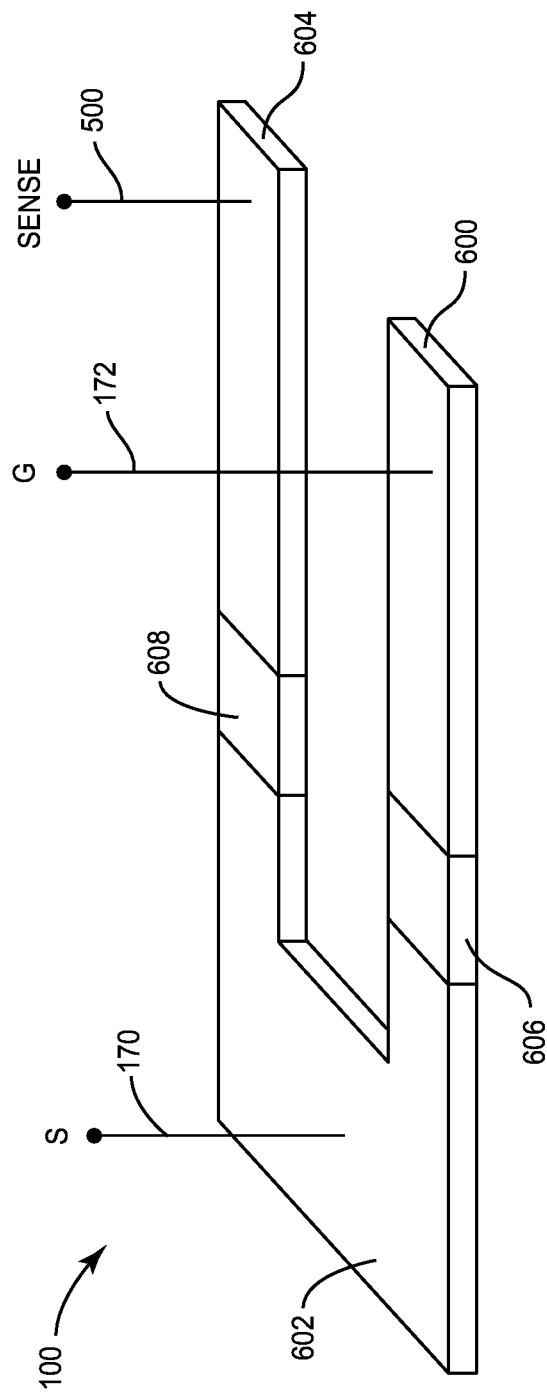
FIG. 13 illustrates a perspective view of an embodiment of a planar gate overvoltage protection device with an additional terminal for temperature sensing.

FIG. 13 illustrates an embodiment of a planar gate overvoltage protection device 100 with an additional temperature sense terminal 500 which can be used e.g. with the embodiment illustrated in FIG. 9 where the protection device 100 is disposed on an ILD 400 above the compound semiconductor body 110. Only the gate overvoltage protection device 100 and corresponding terminals 170, 172, 500 are shown in FIG. 13 for ease of illustration. According to this embodiment, the gate overvoltage protection device 100 comprises a first n-type silicon region 600 connected to the gate terminal 172, a second n-type silicon region 602 connected to the source terminal 170, a third n-type silicon region 604 connected to the additional sense terminal 500, a first p-type silicon region 606 separating the first and second n-type silicon regions 600, 602, and a second p-type silicon region 608 separating the second and third n-type silicon regions 602, 604. Alternatively, a resistor structure with no p-implant in the source-sense path instead can be used for temperature dependent current measurement. In either case, temperature dependent current flow through the gate overvoltage protection device 100 can be measured independently of transistor gate-to-source leakage by providing the additional sense terminal 500.

Figure 14:
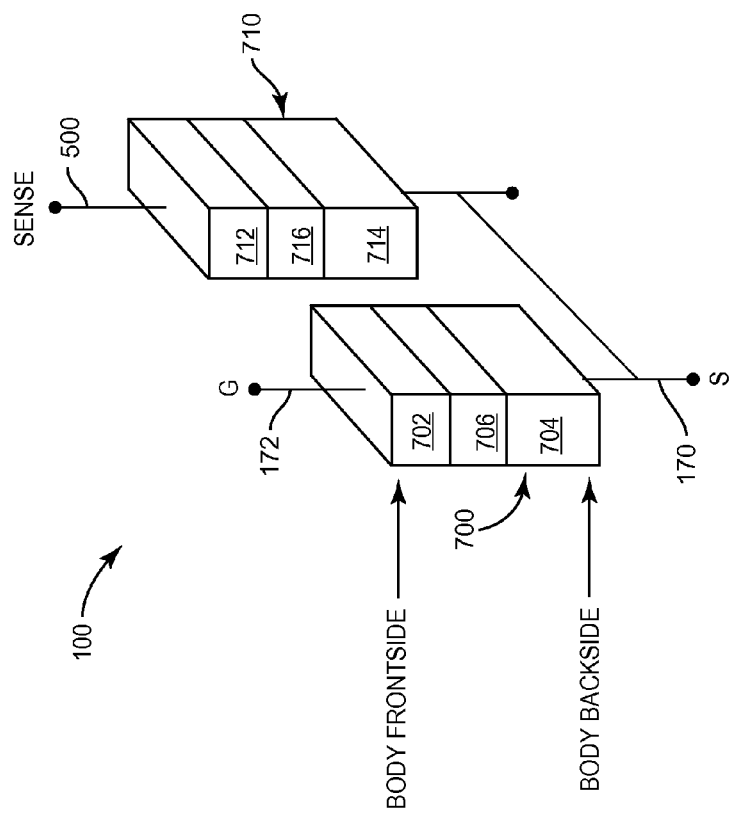
FIG. 14 illustrates a perspective view of an embodiment of a vertical gate overvoltage protection device with an additional terminal for temperature sensing.

FIG. 14 illustrates an embodiment of a vertical gate overvoltage protection device 100 with an additional temperature sense terminal 500. Only the gate overvoltage protection device 100 and corresponding terminals 170, 172, 500 are shown in FIG. 14 for ease of illustration. According to this embodiment, the gate overvoltage protection device 100 comprises a first n-type silicon region 702 disposed in a first trench 700 and connected to the gate 172 at the front side of the compound semiconductor body 110, a second n-type silicon region 704 disposed in the first trench 700 below the first n-type silicon region 702 and connected to the source terminal 170 via the doped substrate 112, and a p-type silicon region 706 disposed in the first trench 700 between the first and second n-type silicon regions 702, 704. A resistor or additional gate overvoltage protection diode is disposed in an additional trench 710 laterally spaced apart from the first trench 700 and the source trench 151. The additional trench 710 extends through the epitaxial layer(s) of the compound semiconductor body 110 to the doped substrate 112. Although not shown in FIG. 14, the trenches 700, 710 are isolated from the surrounding compound semiconductor body e.g. using a dielectric material as previously described herein and illustrated in various other ones of the preceding figures.

A first n-type silicon region 712 disposed in the additional trench 710 is connected to the sense terminal 500 at the front side of the compound semiconductor body 110. A second n-type silicon region 714 is disposed in the additional trench 710 below the first n-type silicon region 712 and connected to the source terminal 170 via the doped substrate 112. A p-type silicon region 716 is disposed in the additional trench 710 between the first and second n-type silicon regions 712, 714 in the case of a protective diode. The intermediary p-type region 716 can be omitted for a resistor device. In either case, the resistor or additional gate overvoltage protection diode disposed in the additional trench 710 is connected to the doped substrate 112 at one end and to the temperature sense terminal 500 at an opposing end.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A transistor device, comprising:
   a compound semiconductor body;
   a drain disposed in the compound semiconductor body;
   a source disposed in the compound semiconductor body and spaced apart from the drain by a channel region;
   a gate operable to control the channel region; and
   a gate overvoltage protection device connected between the source and the gate and comprising p-type and n-type silicon-containing semiconductor material,
   wherein the compound semiconductor body comprises a doped SiC substrate and a SiC epitaxial layer on the doped SiC substrate, the source is electrically connected to the doped SiC substrate through a conductive via disposed in a first trench extending through the SiC epitaxial layer to the doped SiC substrate, the gate overvoltage protection device is disposed in a second trench extending through the SiC epitaxial layer to the doped SiC substrate, the second trench is insulated from the SiC epitaxial layer, and the gate overvoltage protection device comprises alternating regions of p-type and n-type SiC.

2. A transistor device according to claim 1, wherein an n-type SiC region of the gate overvoltage protection device is electrically connected to the gate and a p-type SiC region of the gate overvoltage protection device contacts the doped SiC substrate.

3. A transistor device according to claim 1, wherein the alternating regions of p-type and n-type SiC end prior to the doped SiC substrate, and wherein the gate overvoltage protection device is connected at one end to the gate and to the doped SiC substrate at an opposing end through a conductive via disposed in the second trench between the alternating regions of p-type and n-type SiC and the doped SiC substrate.

4. A transistor device according to claim 1, further comprising a device isolation region adjacent the source, and wherein the gate overvoltage protection device is laterally spaced apart from the source by the device isolation region.

5. A transistor device according to claim 1, wherein the gate overvoltage protection device comprises a first n-type SiC region disposed in the second trench and connected to the gate, a second n-type SiC region disposed in the second trench below the first n-type SiC region and connected to the source, and a p-type SiC region disposed in the second trench between the first and second n-type SiC regions, the transistor device further comprising:
   a drain terminal connected to the drain;
   a gate terminal connected to the gate;
   a source terminal connected to the doped SiC substrate;
   an additional terminal; and
   a resistor or additional gate overvoltage protection device disposed in a third trench laterally spaced apart from the first and second trenches and extending through the SiC epitaxial layer to the doped SiC substrate, the resistor or additional gate overvoltage protection device connected to the doped SiC substrate at one end and to the additional terminal at an opposing end.

6. A transistor device, comprising:
   a GaN semiconductor body;
   a drain disposed in the GaN semiconductor body;
   a source disposed in the GaN semiconductor body and spaced apart from the drain by a channel region;
   a gate operable to control the channel region; and
   a gate overvoltage protection device disposed in a first trench formed in the GaN semiconductor body and connected between the source and the gate, the gate overvoltage protection device comprising alternating p-type and n-type silicon regions.

7. A transistor device according to claim 6, wherein the GaN semiconductor body comprises a doped substrate and one or more compound semiconductor materials on the doped substrate, the source is electrically connected to the doped substrate by a second trench extending through the one or more compound semiconductor materials to the doped substrate, and the gate overvoltage protection device is electrically insulated from the one or more compound semiconductor materials.

8. A transistor device according to claim 7, wherein the gate overvoltage protection device is connected at one end to the gate and to the doped substrate at an opposing end through a conductive via disposed in the first trench between the alternating p-type and n-type silicon regions and the doped substrate.

9. A transistor device according to claim 7, further comprising:
   a drain terminal connected to the drain;
   a gate terminal connected to the gate and one of the silicon regions of the gate overvoltage protection device;
   a source terminal connected to the doped substrate;
   an additional terminal; and
   a resistor or additional gate overvoltage protection device disposed in a third trench laterally spaced apart from the first and second trenches and extending through the one or more compound semiconductor materials with the resistor or additional gate overvoltage protection device connected to the doped substrate at one end and to the additional terminal at an opposing end.

10. A transistor device according to claim 7, wherein the gate overvoltage protection device comprises:
    a first series of alternating p-type and n-type silicon regions disposed in the first trench and which connect the source to the doped substrate; and
    a second series of alternating p-type and n-type silicon regions disposed in the second trench below the source and which connect the gate to the doped substrate, the second series of alternating p-type and n-type silicon regions being electrically insulated from the one or more compound semiconductor materials.

11. A transistor device according to claim 10, further comprising a device isolation region adjacent the source, wherein the source contacts the channel region at one side and is spaced apart from the second series of alternating p-type and n-type silicon regions by the device isolation region at a second side different than the first side.

12. A transistor device according to claim 10, wherein the gate overvoltage protection device is disposed in an inactive region of the transistor device, the source and gate extend from an active region of the transistor device to the inactive region, the first series of alternating p-type and n-type silicon regions connects the source to the doped substrate in the inactive region, and the second series of alternating p-type and n-type silicon regions connects the gate to the doped substrate in the inactive region.

13. A transistor device according to claim 10, further comprising:
   a drain terminal connected to the drain;
   a gate terminal connected to the gate;
   a source terminal connected to the doped substrate; and
   an additional terminal connected to the doped substrate.

14. A transistor device according to claim 10, wherein the first series of alternating regions of p-type and n-type silicon comprises at least one pnp or npn junction, and wherein the second series of alternating regions of p-type and n-type silicon comprises at least one pnp or npn junction.

15. A method of manufacturing a transistor device, comprising:
   forming a drain and a source in a GaN semiconductor body with the drain and the source spaced apart by a channel region;
   forming a gate operable to control the channel region;
   forming a first trench in the GaN semiconductor body; and
   forming a gate overvoltage protection device connected between the source and the gate, the gate overvoltage protection device comprising alternating p-type and n-type silicon regions disposed in the first trench.

16. A method according to claim 15, wherein the GaN semiconductor body comprises a doped substrate and one or more compound semiconductor materials on the doped substrate, the method further comprising:
   forming a second trench extending through the one or more compound semiconductor materials to the doped substrate;
   electrically connecting the source to the doped substrate through the second trench; and
   electrically insulating the first trench from the one or more compound semiconductor materials.

17. A method according to claim 16, further comprising:
   forming a conductive via in a lower part of the first trench and in contact with the doped substrate;
   forming the gate overvoltage protection device in an upper part of the first trench above the conductive via so that the gate overvoltage protection device is connected to the doped substrate at one end through the conductive via; and
   connecting the gate overvoltage protection device at an opposing end to the gate.

18. A method according to claim 16, further comprising:
   connecting a drain terminal to the drain;
   connecting a gate terminal to the gate and one of the silicon regions of the gate overvoltage protection device;
   connecting a source terminal to the doped substrate;
   forming a third trench laterally spaced apart from the first and second trenches and extending through the one or more compound semiconductor materials;
   forming a resistor or additional gate overvoltage protection device in the third trench so that the resistor or additional gate overvoltage protection device is connected to the doped substrate at one end;
   connecting an additional terminal to an opposing end of the resistor or additional gate overvoltage protection device.

19. A method according to claim 16, wherein forming the gate overvoltage protection device comprises:
   forming a first series of alternating p-type and n-type silicon regions in the first trench which connect the source to the doped substrate;
   forming a second series of alternating p-type and n-type silicon regions in the second trench below the source which connect the gate to the doped substrate; and
   electrically insulating the second trench from the one or more compound semiconductor materials.

20. A method according to claim 19, further comprising forming a device isolation region adjacent the source with the source contacting the channel region at one side and spaced apart from the second series of alternating p-type and n-type silicon regions by the device isolation region at a second side different than the first side.

21. A method according to claim 19, wherein forming the gate overvoltage protection device comprises:
   forming the first and second trenches in an inactive region of the transistor device;
   extending the source from an active region of the transistor device to the inactive region and over the first trench so that the source is connected to the doped substrate in the inactive region through the first series of alternating p-type and n-type silicon regions; and
   extending the gate from the active region to the inactive region and over the second trench so that the gate is connected to the doped substrate in the inactive region through the second series of alternating p-type and n-type silicon regions.

22. A method according to claim 19, wherein the first series of alternating regions of p-type and n-type silicon comprises at least one pnp or npn junction, and wherein the second series of alternating regions of p-type and n-type silicon comprises at least one pnp or npn junction.

* * * * *